United States Patent
Adiga et al.

(10) Patent No.: US 12,218,048 B2
(45) Date of Patent: Feb. 4, 2025

(54) ANTI-FUSE AND FUSE STRUCTURES FOR IMPROVING THE FUNCTIONALITY OF QUBIT CIRCUITS

(71) Applicant: INTERNATIONAL BUSINESS MACHINES CORPORATION, Armonk, NY (US)

(72) Inventors: Vivekananda P. Adiga, Ossining, NY (US); Russell A. Budd, North Salem, NY (US); Charles Thomas Rettner, San Jose, CA (US); Stephen M. Gates, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 314 days.

(21) Appl. No.: 17/936,845

(22) Filed: Sep. 29, 2022

(65) Prior Publication Data

US 2024/0113015 A1    Apr. 4, 2024

(51) Int. Cl.
*H01L 23/525* (2006.01)
*H01L 23/532* (2006.01)

(52) U.S. Cl.
CPC ...... *H01L 23/5254* (2013.01); *H01L 23/5258* (2013.01); *H01L 23/53285* (2013.01)

(58) Field of Classification Search
CPC .................................................. H01L 23/5254
USPC ............................................................. 438/2
See application file for complete search history.

(56) References Cited

U.S. PATENT DOCUMENTS

| | | | |
|---|---|---|---|
| 5,920,789 A * | 7/1999 | Bernstein | H01L 23/5254 438/662 |
| 6,378,079 B1 | 4/2002 | Mullarkey | |
| 9,628,086 B2 | 4/2017 | He et al. | |
| 9,935,252 B2 | 4/2018 | Abraham et al. | |
| 10,170,681 B1 | 1/2019 | Rosenblatt et al. | |
| 10,340,438 B2 | 7/2019 | Rosenblatt | |
| 10,431,866 B2 | 10/2019 | Adiga et al. | |
| 10,833,239 B2 | 11/2020 | Brink et al. | |
| 2017/0133576 A1 | 5/2017 | Marcus et al. | |
| 2019/0165244 A1 | 5/2019 | Hertzberg et al. | |
| 2019/0363418 A1 * | 11/2019 | Adiga | H01L 21/76891 |
| 2021/0217947 A1 | 7/2021 | Adiga et al. | |

OTHER PUBLICATIONS

List of IBM Patents or Patent Applications Treated as Related, 2 pgs.

* cited by examiner

*Primary Examiner* — Ajay Arora
(74) *Attorney, Agent, or Firm* — Intelletek Law Group, PLLC; Gabriel Daniel, Esq.

(57) ABSTRACT

A method of constructing a superconducting switch includes depositing a thin sacrificial layer on top of a substrate. The sacrificial layer is patterned to remove portions of the sacrificial layer except at a first portion of the substrate. A superconducting metal layer is patterned on top of the substrate and on top of the sacrificial layer. The superconducting metal layer is patterned to form a superconducting metal line over the sacrificial layer. The patterned sacrificial layer is etched from under the superconducting metal line to release the metal line from the substrate.

25 Claims, 16 Drawing Sheets

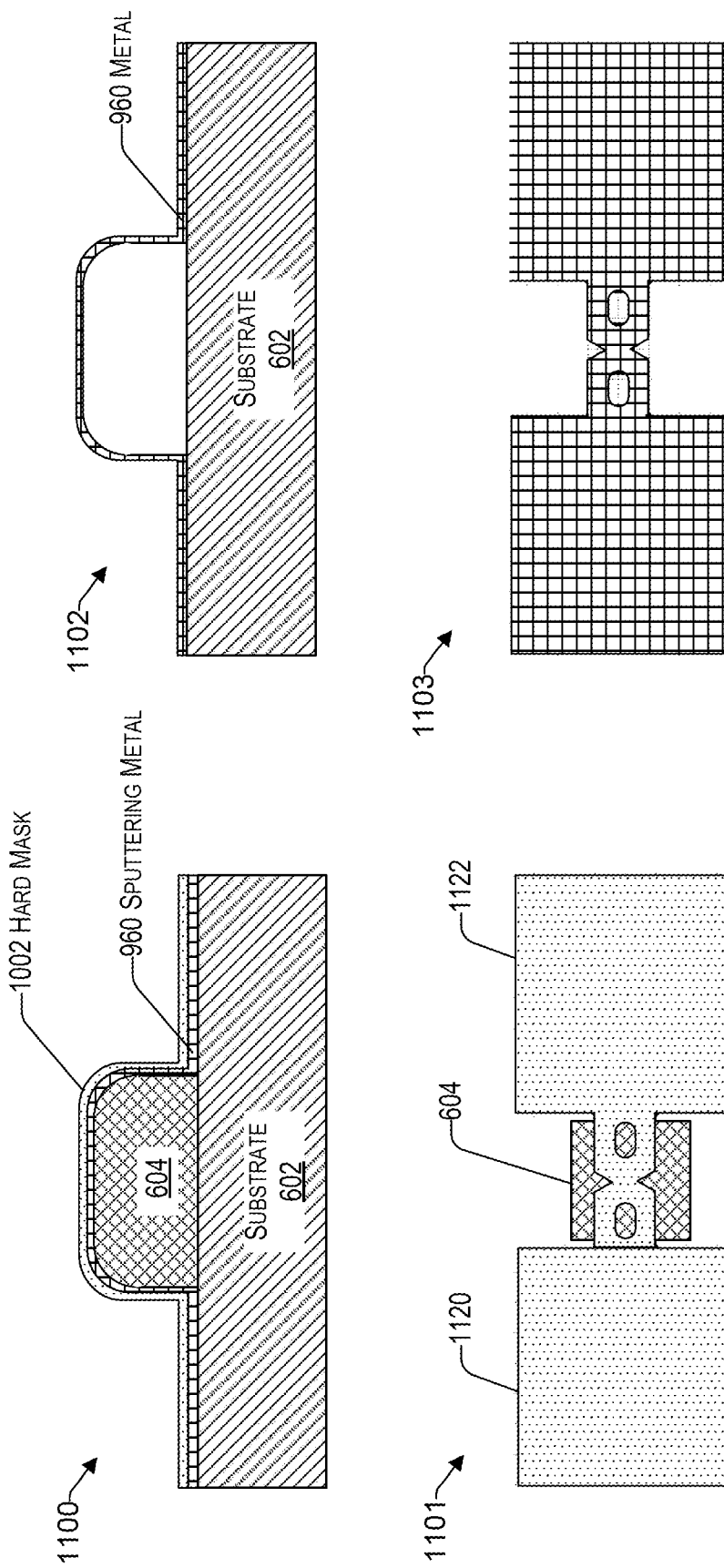

ANTI-FUSE AND FUSE STRUCTURES FOR IMPROVING THE FUNCTIONALITY OF QUBIT CIRCUITS

BACKGROUND

Technical Field

The present disclosure generally relates to quantum circuits, and more particularly, to superconducting connectors that can be used to program quantum circuits.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials. Further, qubit technology is still at its infancy and developing components, such as a qubit having a predetermined frequency with high precision, is a challenge. For example, qubit frequencies can be tuned using coils or by modifying junction resistances using laser or changing the capacitances by either etching into substrate. Each one of these approaches poses its own challenge.

SUMMARY

According to one embodiment, a method of constructing a superconducting switch includes depositing a sacrificial layer on top of a substrate. The sacrificial layer is patterned to remove portions of the sacrificial layer except at a first (e.g., center) portion of the substrate. A superconducting metal layer is deposited on top of the substrate and on top of the sacrificial layer. The superconducting metal layer is patterned to form a superconducting metal line over the sacrificial layer. The patterned sacrificial layer is etched from under the superconducting metal line to release the metal line from the substrate. By forming a metal line over the sacrificial material with compressive stress, the line will buckle up and away from the substrate far enough for it to function as a fuse or anti-fuse, but without the need for a thick sacrificial layer. A large fraction of the height of the line above the substrate comes from the buckling of the line due to the stress, rather than the thickness of the sacrificial material.

In one embodiment, a portion of the superconducting metal line forms an air bridge having a separation from the substrate that is based on a compressive stress in the superconducting metal layer on top of the sacrificial layer.

In one embodiment, the deposition of the superconducting metal layer comprises growing the superconducting metal layer with a compressive stress.

In one embodiment, the compressive stress is higher than a critical buckling stress of the superconducting metal layer.

In one embodiment, the sacrificial layer is 20 nm to 100 nm in thickness.

In one embodiment, the sacrificial layer is constructed of at least one of Titanium (Ti), Titanium nitride (TiN), an oxide, or a nitride.

In one embodiment, the sacrificial layer is configured to stress the superconducting metal layer.

In one embodiment, the method further includes providing etch release holes on the superconducting metal layer.

In various embodiments, the superconducting switch can be an anti-fuse or a fuse.

According to one embodiment, a method of constructing a superconducting switch includes providing a substrate. A sacrificial layer is deposited on top of the substrate. The sacrificial layer is patterned by etching away at least a portion of the sacrificial layer on a lateral first side and on a lateral opposite right side of the sacrificial layer while, maintaining a center (e.g., between the lateral first side and the lateral opposite side) portion of the sacrificial layer. A superconducting metal layer is deposited on top of the substrate and the center portion of the sacrificial layer. A hard mask layer is provided on top of the superconducting metal layer to create a pattern that leaves out a third side and a fourth side of the middle portion of the superconducting metal layer. A superconducting metal layer side wall on the third side and the fourth side between the first side and the second side of the superconducting metal layer are removed. The hard mask layer is removed. The sacrificial layer is removed.

In one embodiment, the sacrificial layer is 200 nm to 500 nm in thickness. By virtue of using this relatively thick sacrificial layer, the sidewalls of the patterned sacrificial material can be smoothed, thereby preventing the superconducting metal line from breaking due to a poor superconducting metal coverage at a sharp step.

In one embodiment, the sacrificial layer comprises at least one of Titanium (Ti), Titanium nitride (TiN), an oxide, or a nitride.

In one embodiment, the sacrificial layer is configured to stress the superconducting metal layer to facilitate a separation of the superconducting metal layer. In this way, a sufficient gap is provided between the superconducting metal line and the substrate at the center portion.

In one embodiment, the method further includes providing etch release holes on the superconducting metal layer.

In one embodiment, a layer of the sacrificial layer that is thinner than that of the middle portion is maintained on the lateral first side and the lateral second side of the sacrificial layer by the patterning.

In one embodiment, the method further includes smoothing one or more sides of the middle portion of the sacrificial layer.

In one embodiment, smoothing the one or more sides of the middle portion of the sacrificial layer includes providing a second sacrificial layer on top of or below the first sacrificial layer, wherein a sacrificial layer of the first and second sacrificial layers that is closer to the substrate has an etch rate that is lower than an etch rate of the sacrificial layer thereon. The first and second sacrificial layers are etched to provide a curved surface on to which to deposit the superconducting metal layer and configured to prevent a structural damage of the superconducting metal layer during processing.

In one embodiment, the hard mask comprises an oxide.

In one embodiment, the hard mask and the sacrificial layer comprise a same material and are removed concurrently during a same etching step. By using a same etching step to remove the hard mask and the sacrificial layer, time and resources are conserved.

According to one embodiment, a method of fabricating a fuse structure includes depositing a sacrificial layer on top of a substrate. The sacrificial layer is patterned to remove portions of the sacrificial layer except at a center portion of the substrate. A superconducting metal layer is deposited on top of the substrate and on top of the sacrificial layer by growing the superconducting metal layer with a compressive stress. The superconducting metal layer is patterned to form a superconducting metal line over the sacrificial layer. The patterned sacrificial layer is etched from under the superconducting metal line to release the metal line from the substrate. A portion of the superconducting metal line forms an air bridge having a separation from the substrate that is based on a compressive stress in the superconducting metal layer on top of the sacrificial layer.

In one embodiment, the compressive stress is higher than a critical buckling stress of the superconducting metal layer.

According to one embodiment, a method of fabricating a fuse structure includes providing a substrate and depositing a sacrificial layer on top of the substrate. The sacrificial layer is patterned by etching away at least a portion of the sacrificial layer on a lateral first side and a lateral opposite second side of the sacrificial layer while maintaining a center portion of the sacrificial layer. A first superconducting metal layer is deposited on top of the substrate and the center portion of the sacrificial layer. A hard mask layer is deposited on top of the superconducting metal layer to create a pattern that leaves out a third side and a fourth side of the middle portion of the superconducting metal layer. A superconducting metal layer side wall on the third side and the fourth side between the lateral first side and the lateral second side of the superconducting metal layer is removed. The hard mask layer is removed, as well as the sacrificial layer. The sacrificial layer is configured to stress the superconducting metal layer to facilitate a separation of the superconducting metal layer.

In one embodiment, the sacrificial layer is constructed of at least one of Titanium (Ti), Titanium nitride (TiN), an oxide, or a nitride.

In one embodiment, a layer of the sacrificial layer that is thinner than that of the middle portion is maintained on the first side and the second side of the sacrificial layer by the patterning.

In one embodiment, the method further includes smoothing one or more sides of the middle portion of the sacrificial layer by providing a second sacrificial layer on vertically top of or below the first sacrificial layer. A sacrificial layer of the first and second sacrificial layers that is vertically closer to the substrate has an etch rate that is lower than an etch rate of the sacrificial layer thereon. The first and second sacrificial layers are etched to provide a curved surface on to which to deposit the superconducting metal layer and configured to prevent a structural damage of the superconducting metal layer during processing.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 11A provides a cross-section view and a top view of a semiconductor structure where the superconducting metal side walls have been removed, consistent with an illustrative embodiment.

FIG. 11B provides a cross-section view and a top view of a semiconductor structure after a removal of the hard mask.

DETAILED DESCRIPTION

Overview

Figure 1:
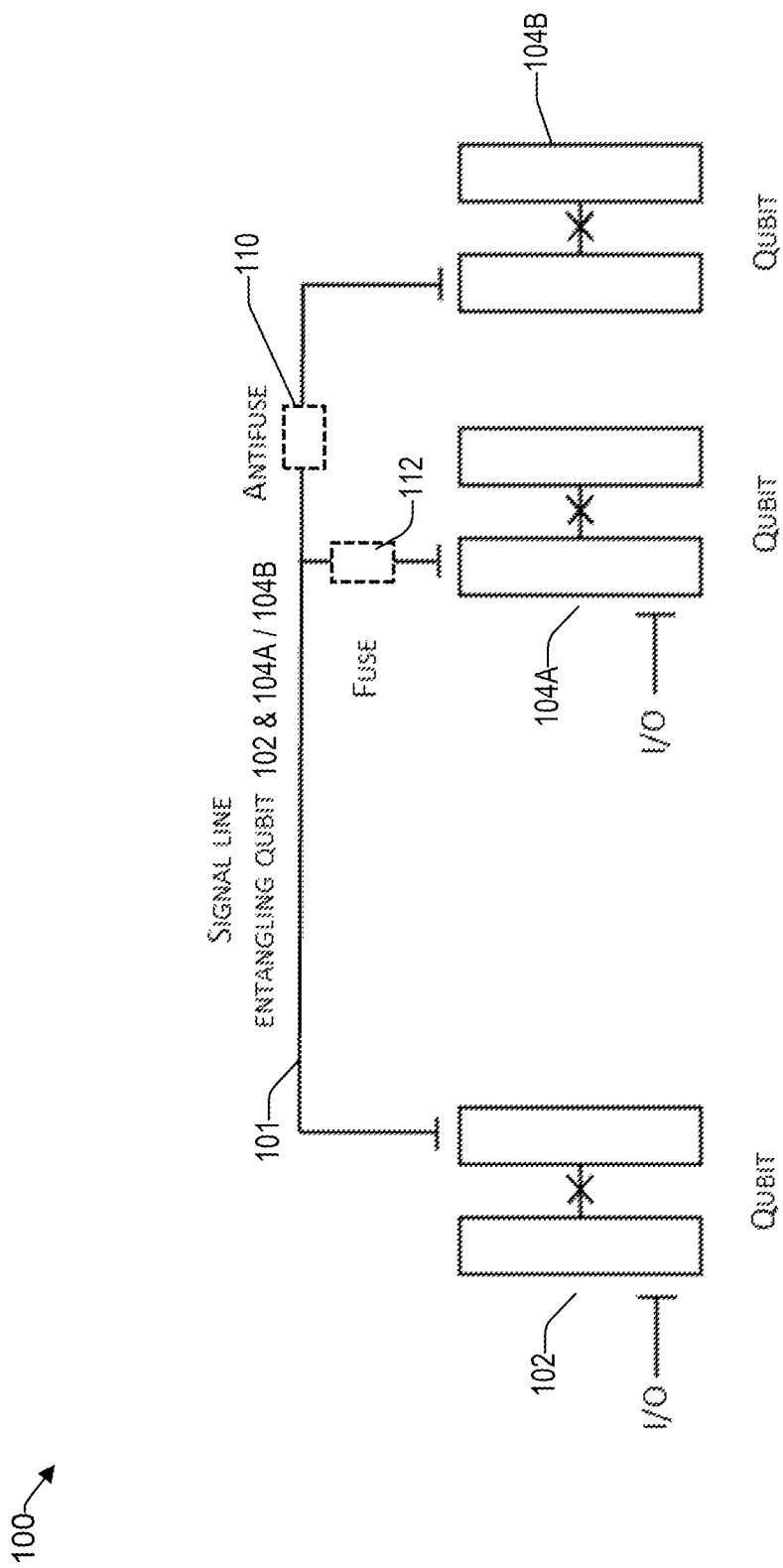
FIG. 1 is an example superconducting switch system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein can relate to superconducting circuits, such as those used in quantum technology and quantum chips. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of superconducting components are supported by the teachings herein as well, including (without limitation), circulators, isolators, amplifiers, filters, active control electronics such as rapid single flux quantum (RSFQ), etc., that can be programmed (e.g., finetuned by way of turning ON and OFF switch devices, sometimes referred to herein as fuses or anti-fuses). Accordingly, various components described herein can be programmed and/or reprogrammed by such fuses and/or anti-fuses. As used herein, a "superconducting fuse device" (sometimes also referred to herein as a "fuse") can comprise a type of superconducting switch device that can provide an electrical connection that can be opened (e.g., to interrupt the flow of electrical current between two electrodes). A "superconducting anti-fuse device" (sometimes also referred to herein simply as an "anti-fuse") can comprise another type of superconducting switch device that can be closed to provide an electrical connection (e.g., to enable electrical current to flow between two electrodes). Fuses and anti-fuses are collectively referred to herein as superconducting switch devices.

A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

Between qubits there may be a coupling resonator, which allows coupling different qubits together in order to realize quantum logic gates. The coupling resonator is typically structurally similar to the readout resonator in that it is a transmission line that includes capacitive connections to ground on both sides, which also results in oscillations within the coupling resonator. When a qubit is implemented as a transmon, each side of the coupling resonator is coupled (e.g., capacitively or inductively) to a corresponding qubit by being in adequate proximity to (e.g., in an effective capacitive coupling distance of) the qubit. Since each side of the coupling resonator has coupling with a respective different qubit, the two qubits are coupled together through the coupling resonator. In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently, but can only be specified for the whole system. In this way, the states of two qubits are linked together such that a measurement of one of the qubits, causes the state of the other qubit to alter. The structures discussed herein can provide redundancy to quantum circuit, where qubits that are to be part of processor and those that are not can be selected.

In one aspect, the teachings herein relate to superconducting switch devices that provide a technical improvement (e.g., benefit) of a programmable and/or a reprogrammable quantum circuit, where based on one or more criteria of a quantum circuit, such as coherence, fidelity, frequency collisions/crowding, efficiency, lattice geometries that enable quantum error correction (i.e., with surface codes) and/or another performance criterion, the connectivity (e.g., coupling) of one or more quantum computing elements can be configured and/or reconfigured. For example, a use could be to disconnect (e.g., via a fuse) certain malfunctioning (e.g., having poor coherence, fidelity, etc.,) portions of the circuits and connecting (e.g., anti-fuse) better performing portions of the circuit to enable efficient operation of a quantum processor. Accordingly, by virtue of the teachings herein, a quantum processor can provide a programmable and/or reprogrammable quantum circuit that can be modified to improve one or more performance criteria of such a quantum circuit and/or provide redundancy (e.g., replacement of malfunctioning components). Such one or more embodiments of the subject disclosure can thereby improve one or more performance criteria (e.g., coherence, accuracy, fidelity, and/or another performance criterion) of such a quantum processor comprising one or more of the various embodiments of the subject disclosure.

In various embodiments, the teachings herein use a thin or thick sacrificial layer to create stress to a superconducting metal to facilitate its buckling away from the substrate, sometimes referred to herein as releasing the superconducting metal, thereby creating a bridge structure having a sufficient gap between the fuse or anti-fuse and the substrate.

In one aspect, these superconducting switch devices provide bidirectional and/or incremental frequency tuning capability by adding and/or removing circuit elements, such as capacitors and/or inductors in the quantum circuits, as well as providing redundancy, thereby enhancing the reliability of a quantum system. The superconducting switch devices simplify the fabrication process while not adversely impacting qubit coherence. The techniques described herein may be implemented in a number of ways. Example implementations are provided below with reference to the following figures.

Example Superconducting Switch System

Reference now is made to FIG. 1, which is an example superconducting switch system 100, consistent with an illustrative embodiment. In the example of FIG. 1, one or more superconducting switch devices, represented by anti-fuse 110 and fuse 112 can be used to alter the entangling state (e.g., connected and disconnected) between quantum computing elements, represented by qubits 102, 104A, and 104B using the signal line 101. By way of example, consider a fabrication defect rendering qubit 104A defective. The signal line 101 can be reprogrammed to alter the entangling between qubit 102 and qubits 104A and 104B. For example, the signal line 101 can be severed between qubit 102 and qubit 104 by programming (e.g., blowing) fuse 112. The signal line 101 can be connected to qubit 104B instead by programming (e.g., shorting) anti-fuse 110, thereby entangling qubit 102 with previously redundant qubit 104B. In this way, an example programmable quantum circuit is provided. In one embodiment, the anti-fuse 110 and the fuse 112 are fabricated on a common layer, which substantially reduces complexity and manufacturing cost. The fabrication of the subject fuses and anti-fuses is discussed in more detail later.

Example Fuse and Anti-Fuse Structures and Fabrication Thereof

The teachings herein provide various superconducting switch devices that may be implemented as fuses and/or anti-fuses. These superconducting switch devices can be used, for example, to alter the coupling of a first quantum computing element and a second quantum computing element that is coupled to the electrodes of a superconducting switch device. The fabrication of the superconducting switch devices discussed herein can comprise multi-step sequences of, for example, photolithographic and/or chemical processing steps that facilitate creation of electronic-based systems, devices, components, and/or circuits in a semiconducting and/or a superconducting device (e.g., an integrated circuit). For instance, a superconducting switch device can be fabricated on one or more substrates. In various embodiments, the substrate, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top. In another embodiment, the substrate comprises intrinsic (i.e., undoped) silicon (Si). Other materials that may be used for the substrate include, without limitation, sapphire, aluminum oxide, germanium, gallium arsenide (GaAs) or any of the other III-V periodic table compounds, indium phosphide (InP), silicon carbide (SiC), a superconducting alloy of silicon and germanium, quartz, etc. Thus, as used herein, the term substrate 206 refers to a foundation upon which various superconducting structures can be built.

The superconducting fuse or anti-fuse structures discussed herein can be fabricated by using various techniques including, but not limited to: photolithography, microlithography, nanolithography, nanoimprint lithography, photo-masking techniques, patterning techniques, photoresist techniques (e.g., positive-tone photoresist, negative-tone photoresist, hybrid-tone photoresist, and/or another photoresist technique), etching techniques (e.g., reactive ion etching (ME), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), back-grinding techniques, and/or another technique for fabricating an integrated circuit.

In one aspect, the teachings herein provide a superconducting switch device that can be constructed by using a sacrificial material, sometimes referred to herein as a sacrificial layer. In this regard, reference is made to FIG. 2, which illustrates a cross-section view of a semiconductor structure 200 having a substrate 202 and a sacrificial layer 204 thereon, consistent with an illustrative embodiment. The sacrificial layer may comprise titanium (Ti), titanium nitride (TiN), silicon oxide, Tungsten, or any combination thereof and/or any other suitable sacrificial layer used in micro and/or nano fabrication. In one embodiment, the sacrificial layer 204 is a thin layer (e.g., 20 nm-100 nm) of oxide that is deposited and patterned on the substrate 202 using deposition techniques described herein. This sacrificial material is patterned so that there are localized release layers underneath the superconducting metal layer that will be patterned on it at a later stage of fabrication.

Figure 3:
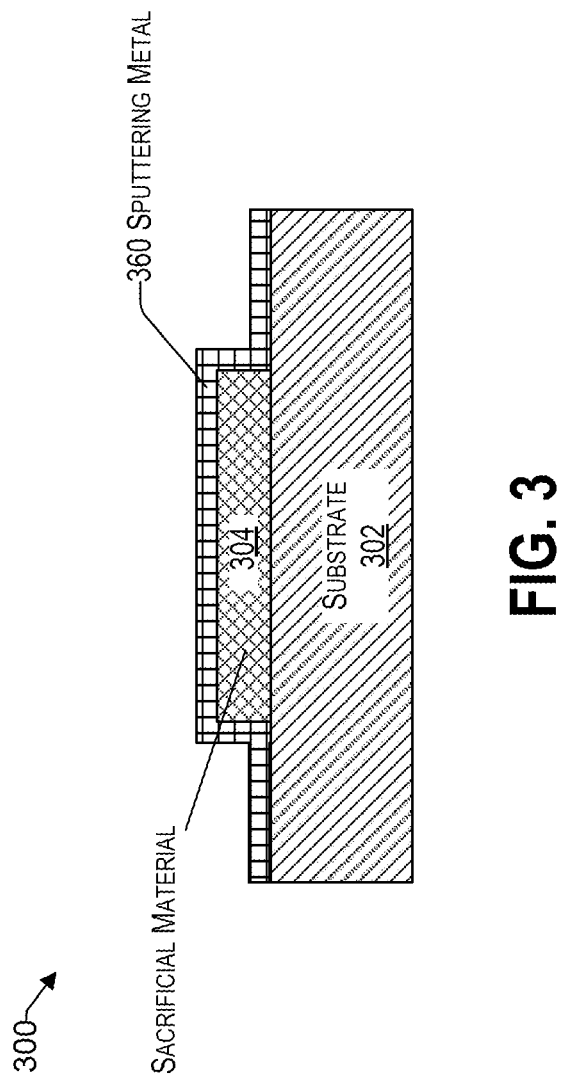
FIG. 3 provides a cross-section view of a semiconductor structure having a superconducting metal thereon, consistent with an illustrative embodiment.

FIG. 3 provides a cross-section view of a semiconductor structure 300 having a superconducting metal 360 (e.g., film) thereon. In various embodiments, chemical vapor deposition (CVD), atomic layer deposition (ALD), or physical vapor deposition (PVD), such as sputtering, can be used to deposit the superconducting metal 360. This superconducting metal layer 360 is patterned on the substrate and sacrificial layer and does not need to be aligned in any crystalline direction of the substrate 302. Further, while etch release holes can be used, they are not required. Still further, the substrate need not be etched, thereby simplifying the manufacturing process and making it compatible with other semiconductor structures.

It has been determined that by using such a thin layer (e.g., 20 nm to 100 nm) of the sacrificial layer 304, the concern of shaping of an oxide and removal of metal sidewalls is mitigated, as will be discussed in more detail below. The sacrificial layer 304 is configured to create stress to the superconducting metal layer 360 thereon.

Figure 4:
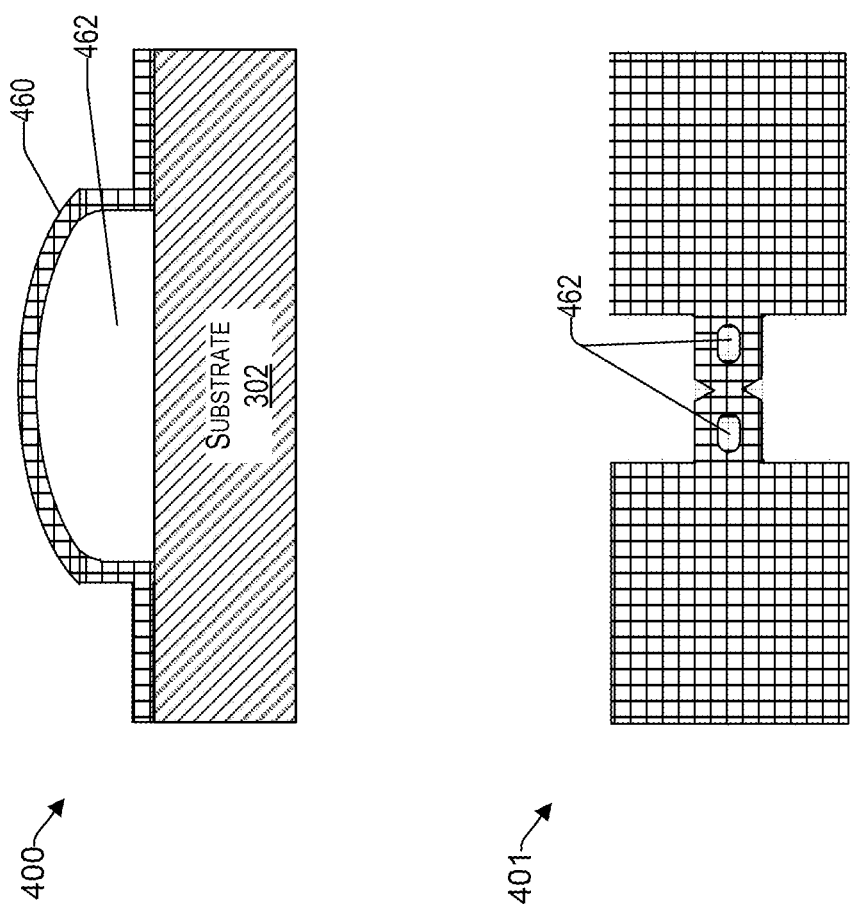
FIG. 4 provides a cross-section view and a top view of a bridge structure where the sacrificial layer has been removed, consistent with an illustrative embodiment.

FIG. 4 provides a cross-section view 400 and a top view 401 of a bridge structure where the sacrificial layer 304 has been removed, consistent with an illustrative embodiment. In some embodiments, there are one or more etch release holes 440. The sacrificial layer 304 can be removed via any suitable technique (e.g., wet etching, ion milling) using, for example, TMAH, KOH, Buffered Oxide Etchant, Hydrogen Fluoride, Hydrogen peroxide etc., thereby leaving a cavity 462 where the sacrificial layer previously was located. As illustrated 400, by removing the sacrificial layer 304, the metal layer 460 pops up (i.e., buckles away) from the substrate 302 in the region where the sacrificial layer 304 is removed. Accordingly, the construction of the suspended bridge 460 of FIG. 4 involves relatively few processing steps. In this embodiment, the bridge 460 may be in any direction. Stated differently, the structure of FIG. 4 is not dependent on the crystalline structure of the substrate 302.

The architecture and processing steps of the suspended bridge may be better appreciated with respect to the fact that using sacrificial layer that is thicker than 20 nm to 100 nm can be a source of concern regarding the superconducting metal, that gets coated on the side walls of the patterned sacrificial layer. For example, referring back to FIG. 3, it is desirable to maintain a substantially similar thickness of the superconducting metal layer 360 (e.g., film). However, as the sacrificial layer becomes thicker (i.e., taller), the ratio of the thickness between the sidewall and the remaining thickness of the metal may become too large (i.e., the sidewalls becoming too thin) for providing the required mechanical strength to warrant the functionality and structural integrity of the superconducting switch device 300. In this regard, it has been determined that a thickness of 20 nm to 100 nm of the sacrificial layer 304 provides a good balance between a required gap (i.e., after popping) between the bridge and the substrate 302, while maintaining the structural integrity of the superconducting metal.

Figure 2:
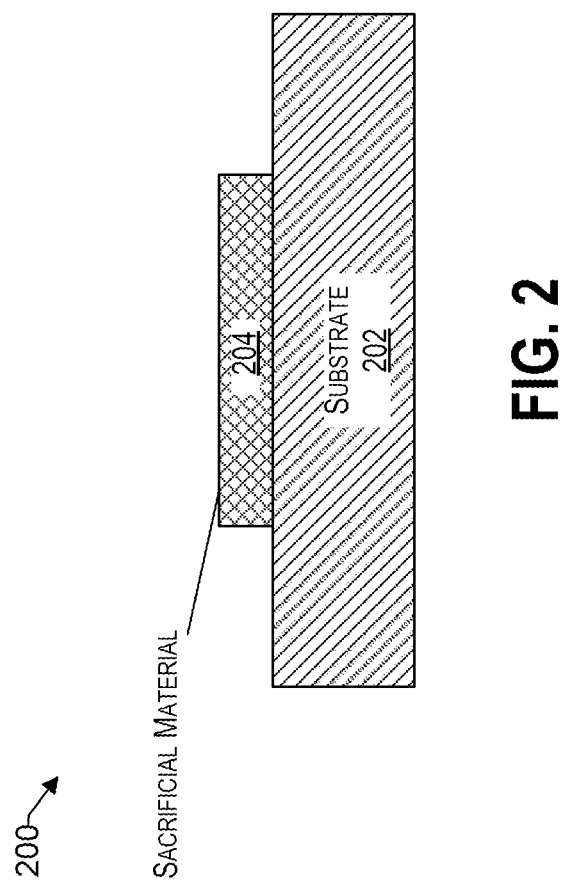
FIG. 2 illustrates a cross-section view of a semiconductor structure having a substrate and a sacrificial layer thereon, consistent with an illustrative embodiment.
Figure 5:
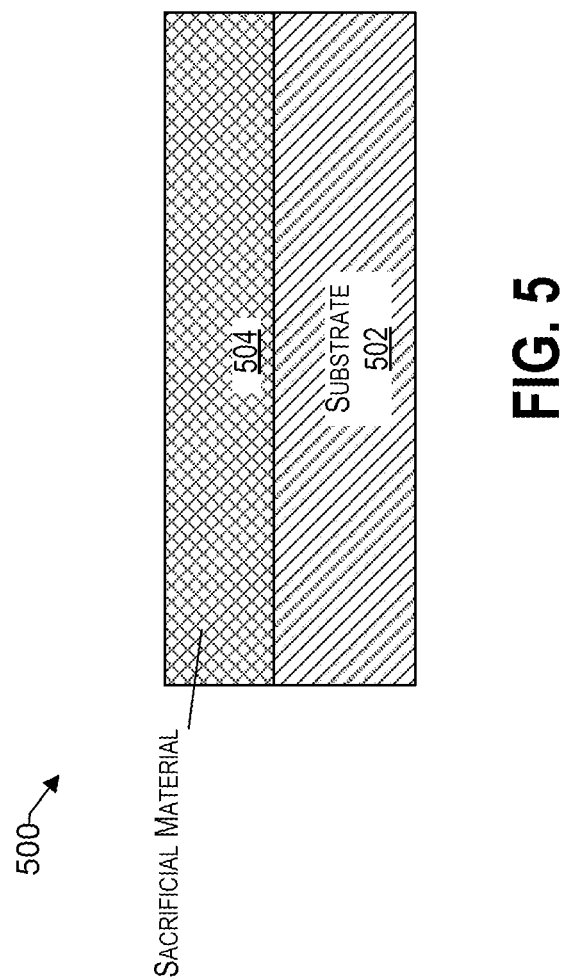
FIG. 5 illustrates a semiconductor structure comprising a substrate with a sacrificial layer on top that can be used as a foundation of creating another superconducting switch structure, consistent with an illustrative embodiment.

As mentioned above, the construction of the superconducting switch device discussed in the context of FIGS. 2 to 4 are not subject to a requirement of shape engineering (e.g., shaping of the oxide) as well as removal of any metal sidewalls, which remain during the patterning of the metal during an anisotropic etch. In another embodiment, these issues are taken into consideration. FIG. 5 illustrates a semiconductor structure 500 comprising a substrate 502 with a sacrificial layer on top that can be used as a foundation of creating another superconducting switch structure, consistent with an illustrative embodiment. The sacrificial layer can be relatively thick (e.g., 200 nm to 1000 nm) and deposited using known deposition techniques. Using such a thick oxide provides the benefit of not having to rely on the stress in a metal to create a gap between the substrate and the released bridge portion of the metal. Instead, the thickness of the sacrificial layer 504 itself provides the sufficient gap, as discussed in more detail below.

Figure 6:
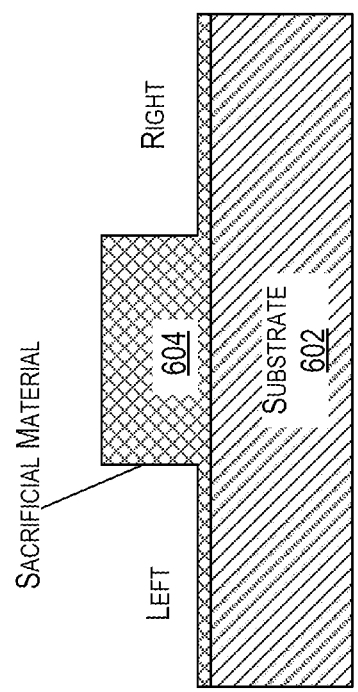
FIG. 6 illustrates a semiconductor structure where the sacrificial layer is patterned by etching away at least a portion of the sacrificial layer on a left side and on a right side of the structure, consistent with an illustrative embodiment.

FIG. 6 illustrates a semiconductor structure 600 where the sacrificial layer 604 is patterned by etching away at least a portion (e.g., 90% or more) of the sacrificial layer on a left side and on a right side of the structure 600, consistent with an illustrative embodiment. While a substantially thinner layer of the sacrificial layer 604 may be maintained on the left and right sides (e.g., 50 nm), in one embodiment, the sacrificial layer can be completely removed from the left and right sides.

Figure 7:
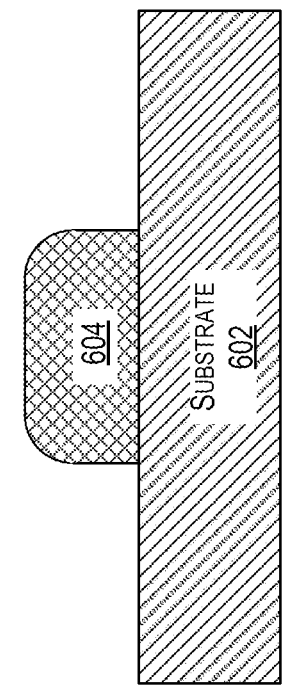
FIG. 7 is a semiconductor structure where the sacrificial layer is smoothed at the edges, consistent with an illustrative embodiment.

FIG. 7 is a semiconductor structure 700 where the sacrificial layer 604 is smoothed at the edges, consistent with an illustrative embodiment. By way of example and not limitation, hydrofluoric acid (HF) or hydrogen peroxide or any suitable etchant can be used for smoothing the edges (e.g., corners) depending on the sacrificial material. The smoothing at the corners of the center portion of the sacrificial layer 604 can facilitate a more uniform and reliable formation of metal thereon as discussed below. For example, a cracking of a metal deposited on top of the structure 700 can be prevented. In one embodiment, any remaining sacrificial layer on the left side and right side of the center portion 604 of the sacrificial layer is removed.

Figure 8:
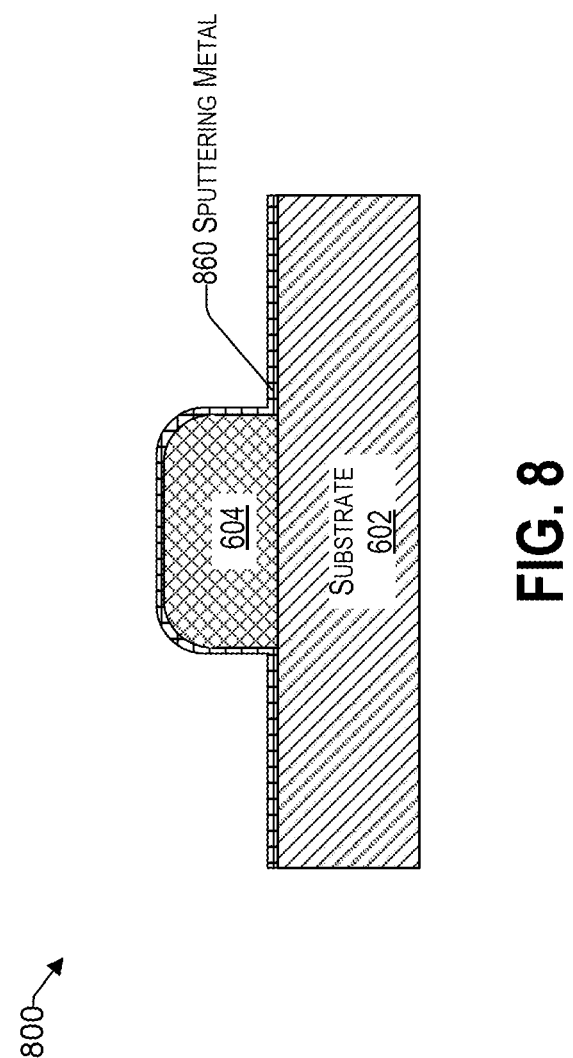
FIG. 8 is a cross-section view of a semiconductor structure having a metal layer on top of the substrate and the sacrificial layer, consistent with an illustrative embodiment.

FIG. 8 is a cross-section view of a semiconductor structure 800 having a metal layer 860 on top of the substrate 602 and the sacrificial layer 604, consistent with an illustrative embodiment. In various embodiments, chemical vapor deposition (CVD), atomic layer deposition (ALD), or physical vapor deposition (PVD), such as sputtering, can be used to deposit the superconducting metal layer 860.

Figure 9:
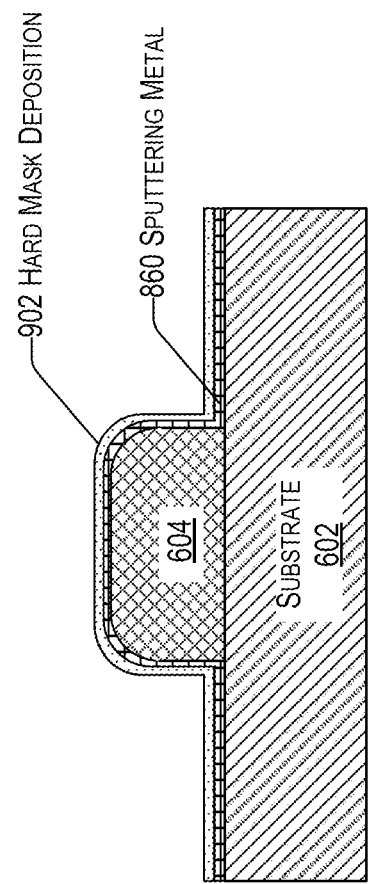
FIG. 9 is a cross-section view of a semiconductor structure having a hard mask deposited on the metal layer, consistent with an illustrative embodiment.

FIG. 9 is a cross-section view of a semiconductor structure 900 having a hard mask 902 deposited on the metal layer 860, consistent with an illustrative embodiment. The hard mask 902 is used as an etch mask that is deposited and etched into an appropriate pattern using standard photoresist processes, to pattern an air bridge. In one example, the hard mask is an oxide. It should be noted that perforations, sometimes referred to herein as etch release holes may be used in a hard mask, but are not necessary. Accordingly, in one embodiment, the process can be simplified by not using etch holes.

The hard mask 902 facilitates creating a pattern that leaves out a first side and a second side of the middle portion of the superconducting metal layer. Consequently, the underlying material can be etched in regions where there is no hard mask 902, as will become more apparent in view of the FIGS. discussed below.

Figure 10A:
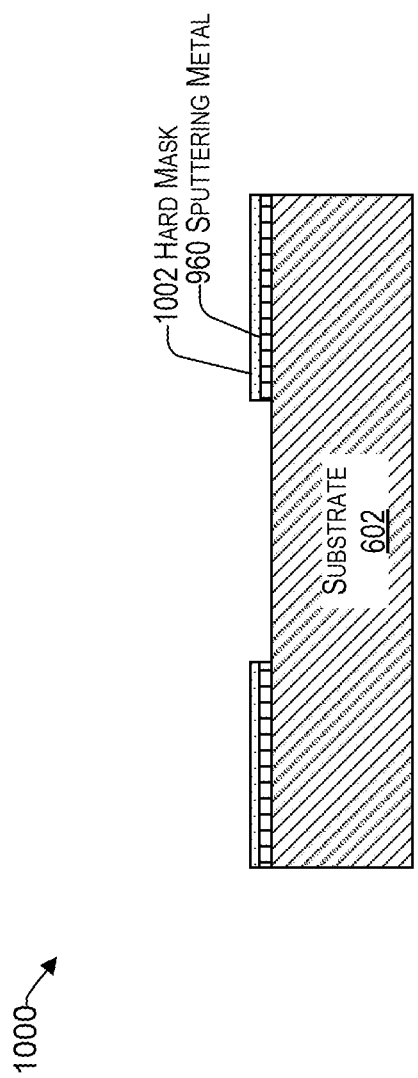
FIG. 10A is a cross-section view of a semiconductor structure where there is no air bridge, consistent with an illustrative embodiment.
Figure 10B:
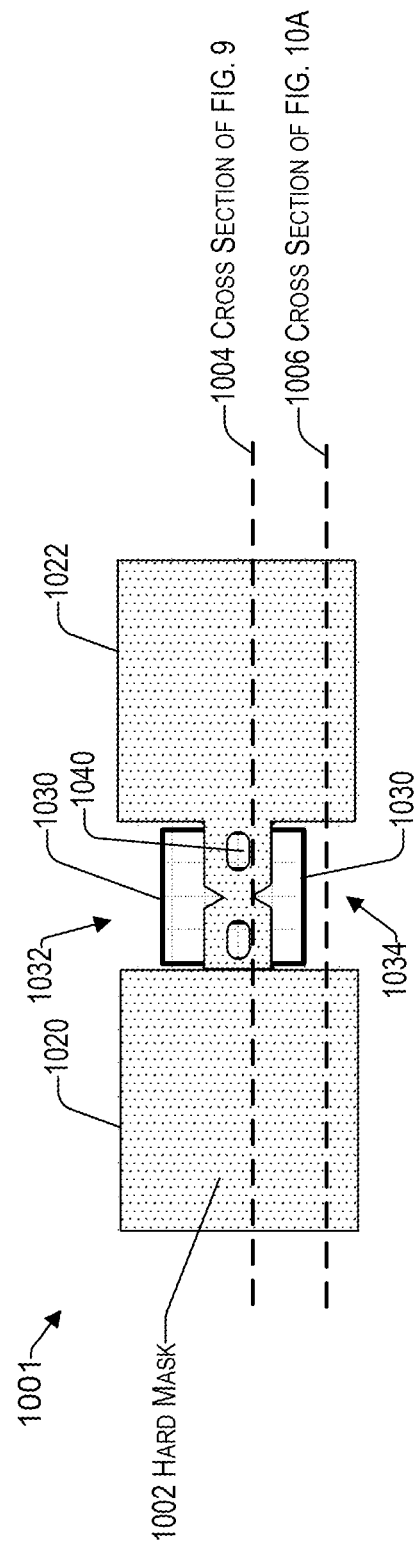
FIG. 10B provides a top view of the semiconductor structure of FIG. 11A.

FIG. 10A is a cross-section view of a semiconductor structure 1000 where there is no air bridge, consistent with an illustrative embodiment. FIG. 10A can be better appreciated in view of FIG. 10B, which provides a top view 1001 of the semiconductor structure of FIG. 10A. More specifically, FIG. 10A is a cross section view at 1006 of FIG. 10A. For example, when the air-bridges are patterned during the hard mask deposition process of FIG. 10, it can be through a plasma process, which is mostly line of sight. In some embodiments, there are etch release holes 1040. Consequently, there is additional metal at the sidewall 1030 which is not thinned down during a plasma etching. This sidewall 1030 has the potential of shorting the two pads (e.g., left side 1020 and right side 1022 of the bridge). The hard mask layer 1002 on top of the superconducting metal layer creates a pattern that leaves out a first side 1032 and a second side 1034 of the middle portion of the superconducting metal layer. The hardmask 1002 facilitates the removal of the metal 1030, thereby avoiding a short between a left portion 1020 and a right portion 1022 of the structure 1001. While a wet etch is preferred to remove the sidewall 1030 that is not covered by the hard mask 1002, in one embodiment an isotropic dry etch can be used.

FIG. 11A provides a cross-section view 1100 and a top view 1101 of a semiconductor structure where the superconducting metal side walls have been removed, consistent with an illustrative embodiment. Accordingly, the sacrificial layer 604 is shaped in such a way as to be able to remove the metal sidewalls. In one example silicon dioxide ($SiO_2$) is used as the sacrificial layer 604.

FIG. 11B provides a cross-section view 1102 and a top view 1103 of a semiconductor structure after a removal of the hard mask 1002. The sacrificial layer 604 is removed as well. In one embodiment, the hard mask 1002 and the sacrificial layer 604 are removed concurrently, thereby reducing processing steps and cost.

Figure 12:
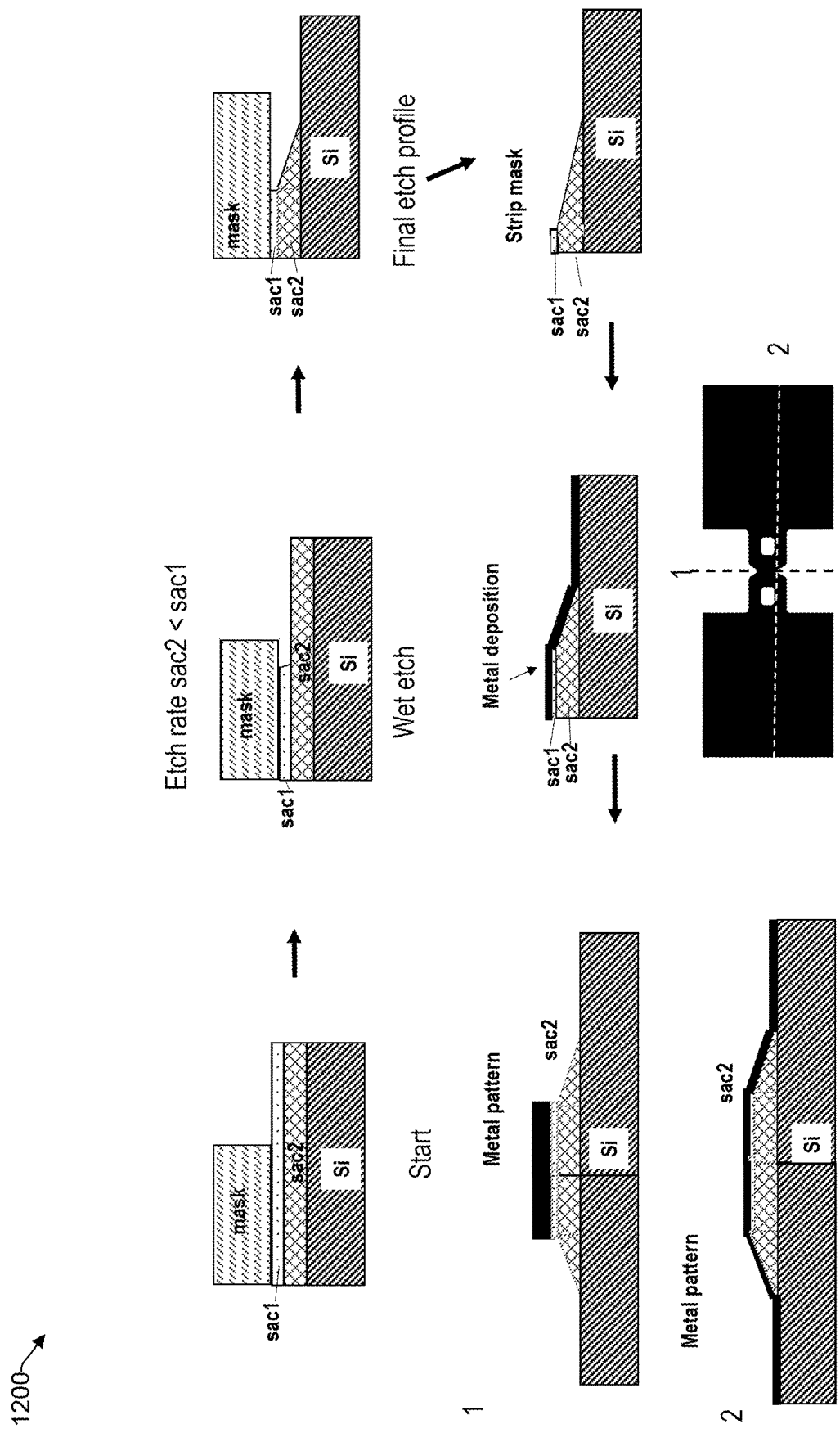
FIG. 12 illustrates processing steps involved in smoothing the superconducting metal deposition by way of using two separate sacrificial masks, consistent with an illustrative embodiment.

As discussed previously, a metal sidewall having a height above a predetermined threshold (i.e., due to the thickness of the sacrificial layer) can benefit from smoothing while patterning it. In this regard, FIG. 12 illustrates processing steps involved in smoothing the superconducting metal deposition by way of using two separate sacrificial layers, consistent with an illustrative embodiment. The smoothing of the superconducting metal maintains the integrity of the suspended portion of the superconducting metal. The smoothing also helps with patterning of the superconducting metal without requiring a hard mask described in previous approach. In the approach depicted in FIG. 12, a stack of at least two sacrificial layers is used, wherein a lower sacrificial layer (i.e., closer to the substrate) has an etch rate that is lower than the etch rate of the sacrificial layer thereon. In this way a smoother (e.g., without abrupt edges) superconducting metal can be deposited on the substrate, first sacrificial layer and second sacrificial layer. Accordingly, the integrity and reliability of the metal layer (e.g., film) are improved.

Figure 13:
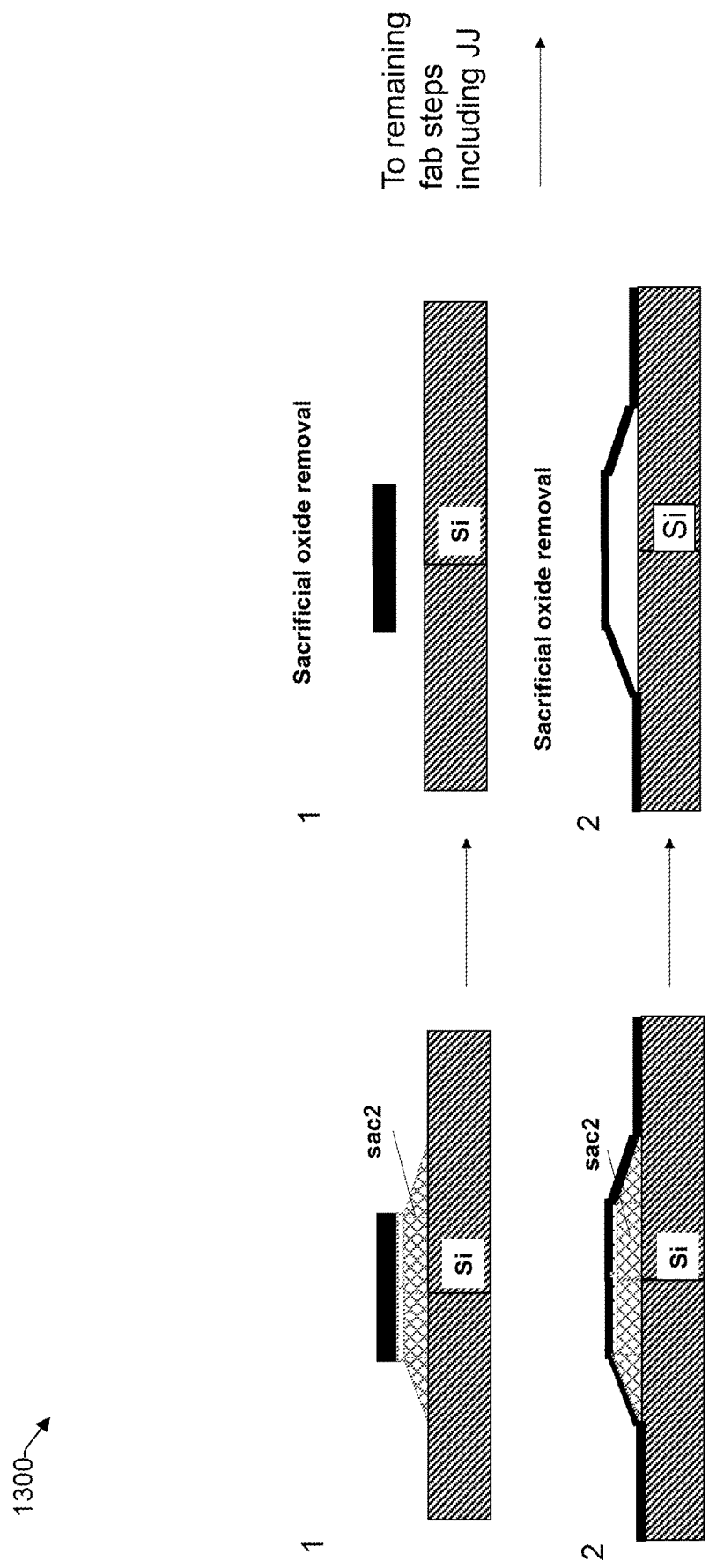
FIG. 13 provides cross-section views of processing steps in the removal of a sacrificial oxide, consistent with an illustrative embodiment.

FIG. 13 provides cross-section views of processing steps in the removal of a sacrificial oxide, consistent with an illustrative embodiment. The cross-section views of FIG. 13 describe a status after sacrificial material removal. For example, if the sacrificial material is an oxide HF/buffered oxide etch (BOE) can be used.

Although the figures generally illustrate structures that are consistent with fuses by way of example for reasons of simplicity, anti-fuses are within the scope of the present disclosure. In one embodiment, anti-fuses that can be on the same superconducting metal plane as that of the fuse. For example, both anti-fuses and fuses can be fabricated at the same time and having a common superconducting metal layer, and can even be programmed concurrently.

While the manufacture of a single superconducting switch device or a pair of switch devices is described for the purposes of discussion, it will be understood that other configurations, as well as those having multiple fuses and anti-fuses that disconnect or connect multiple superconducting circuit elements are supported by the teachings herein.

In one aspect, the method and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

Example Processes

Figure 14:
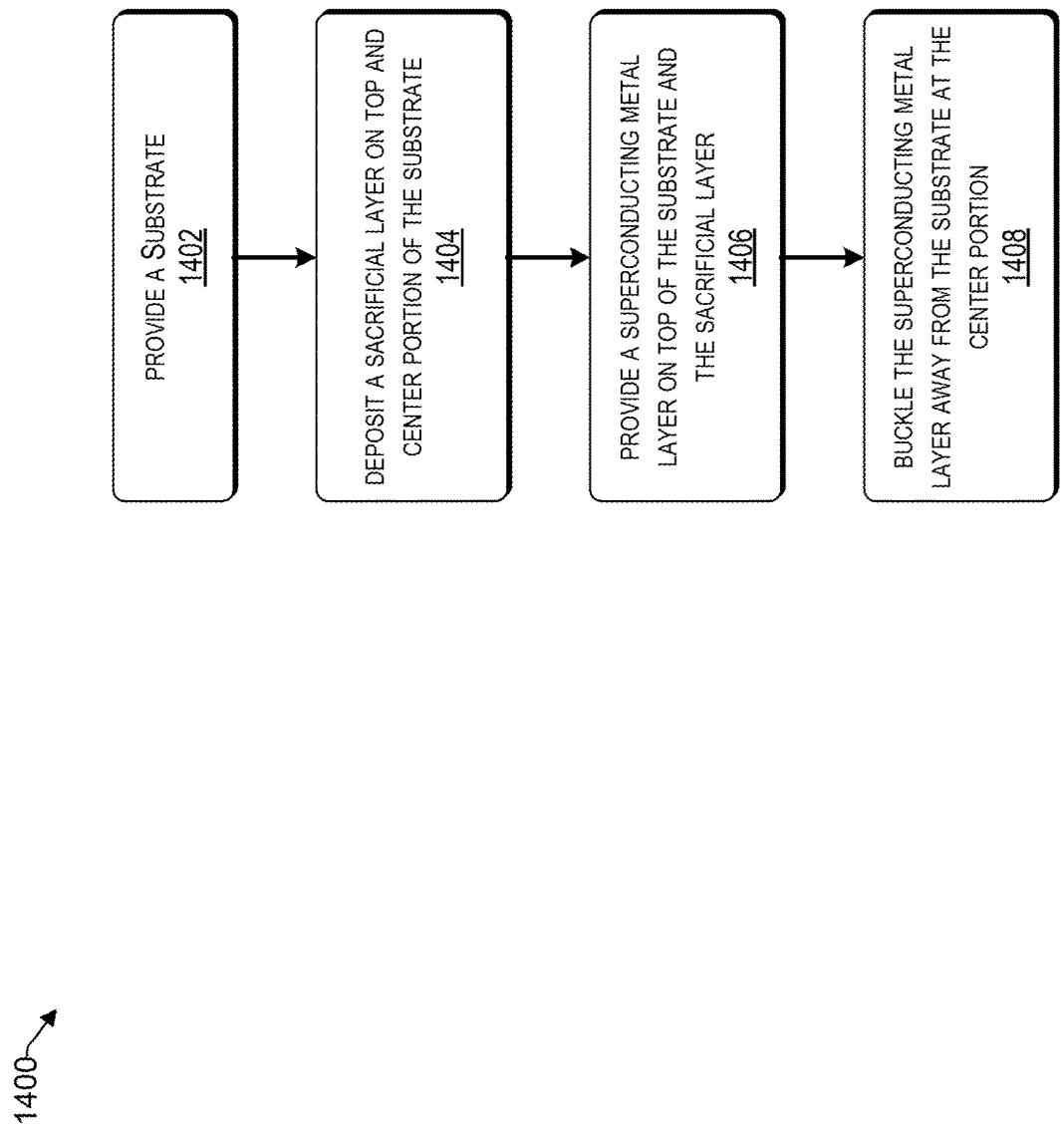
FIG. 14 is a process that relates to orchestration of the creation of superconducting switch device that uses a thin sacrificial material on a substrate, similar to that discussed in the context of FIGS. 2 to 4.
Figure 15:
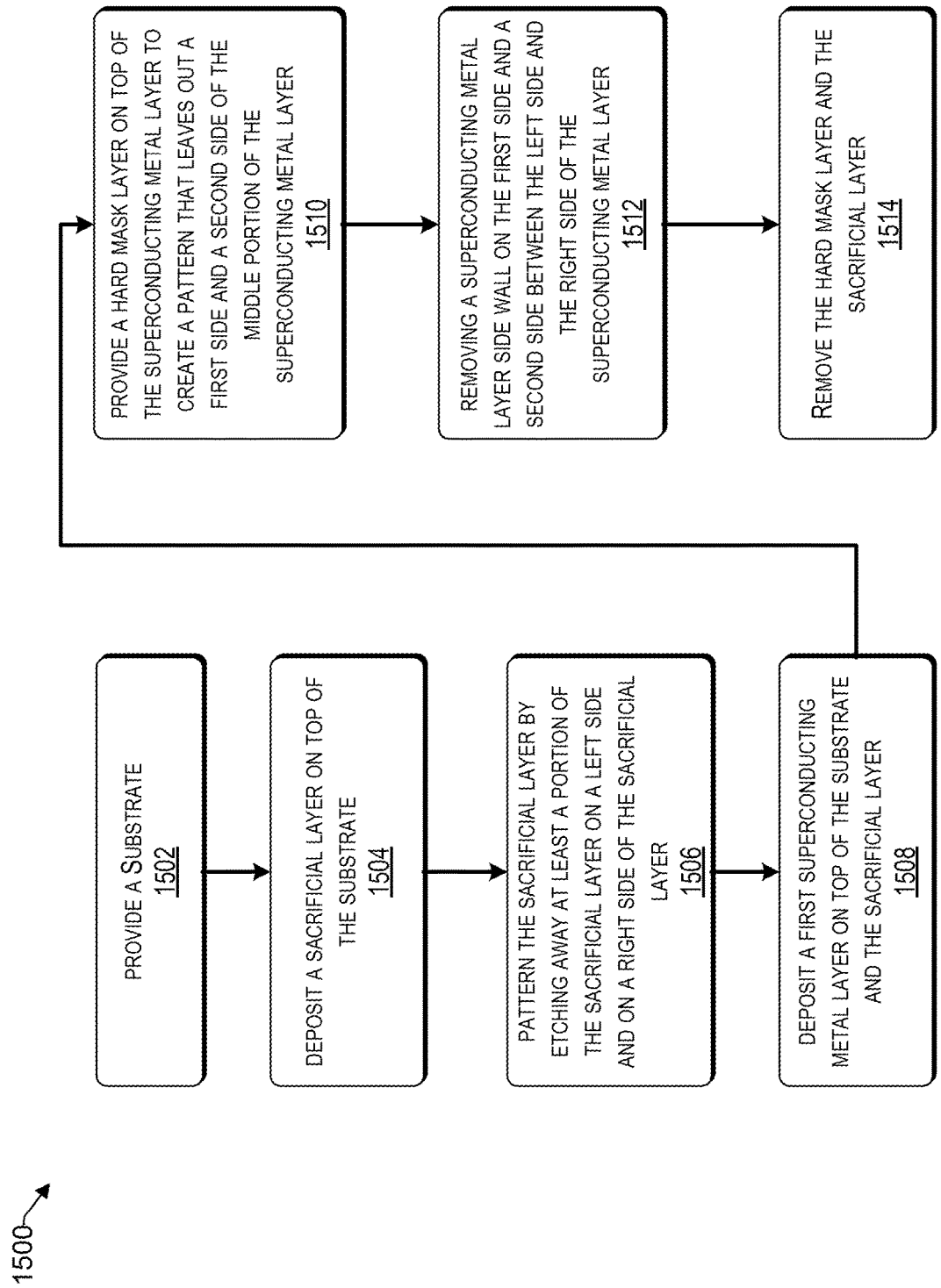
FIG. 15 is a process that relates to orchestration of the creation of a superconducting switch device that uses a thick sacrificial material, similar to that described in the context of FIGS. 5 to 11A/B.

With the foregoing overview of the descriptions of superconducting switch devices, it may be helpful now to consider a high-level discussion of example fabrication processes of the structures discussed herein that may be controlled by an appropriately configured one or more computing devices. To that end, FIGS. 14 to 15 present example processes 1400 and 1500 for constructing superconducting switch devices, consistent with illustrative embodiments. More specifically, process 1400 to 1500 relate to methods of constructing superconducting switches that may be implemented as fuses and/or anti-fuses. Processes 1500 to 1700 are each illustrated as a collection of blocks in a logical flowchart, which represents sequence of operations that can be implemented in hardware, controlled by software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process.

FIG. 14 is a process 1400 that relates to orchestration of the creation of superconducting switch device that uses a thin sacrificial material on a substrate, similar to that discussed in the context of FIGS. 2 to 4. At block, 1402, a substrate is provided. At block 1404 a sacrificial layer is deposited on top and center portion of the substrate. At block 1406 a superconducting metal layer is provided on top of the substrate and the sacrificial layer. At block 1408, the superconducting metal layer is buckled away from the substrate at the center portion.

FIG. 15 is a process 1500 that relates to orchestration of the creation of a superconducting switch device that uses a thick sacrificial material, similar to that described in the context of FIGS. 6 to 12A/B. At block 1502, a substrate is provided. At block 1504 a sacrificial layer is deposited on top of the substrate. At block 1506, the sacrificial layer is patterned by etching away at least a portion of the sacrificial layer on a left side and on a right side of the sacrificial layer. At block 1508, a first superconducting metal layer is deposited on top of the substrate and the sacrificial layer. At block 1510, a hard mask layer is provided on top of the superconducting metal layer to create a pattern that leaves out a first side and a second side of the middle portion of the superconducting metal layer. At block 1512, a superconducting metal layer side wall is removed on the first side and a second side between the left side and the right side of the superconducting metal layer. At block 1514, the hard mask layer and the sacrificial layer are removed.

Example Computer Platform

Figure 16:
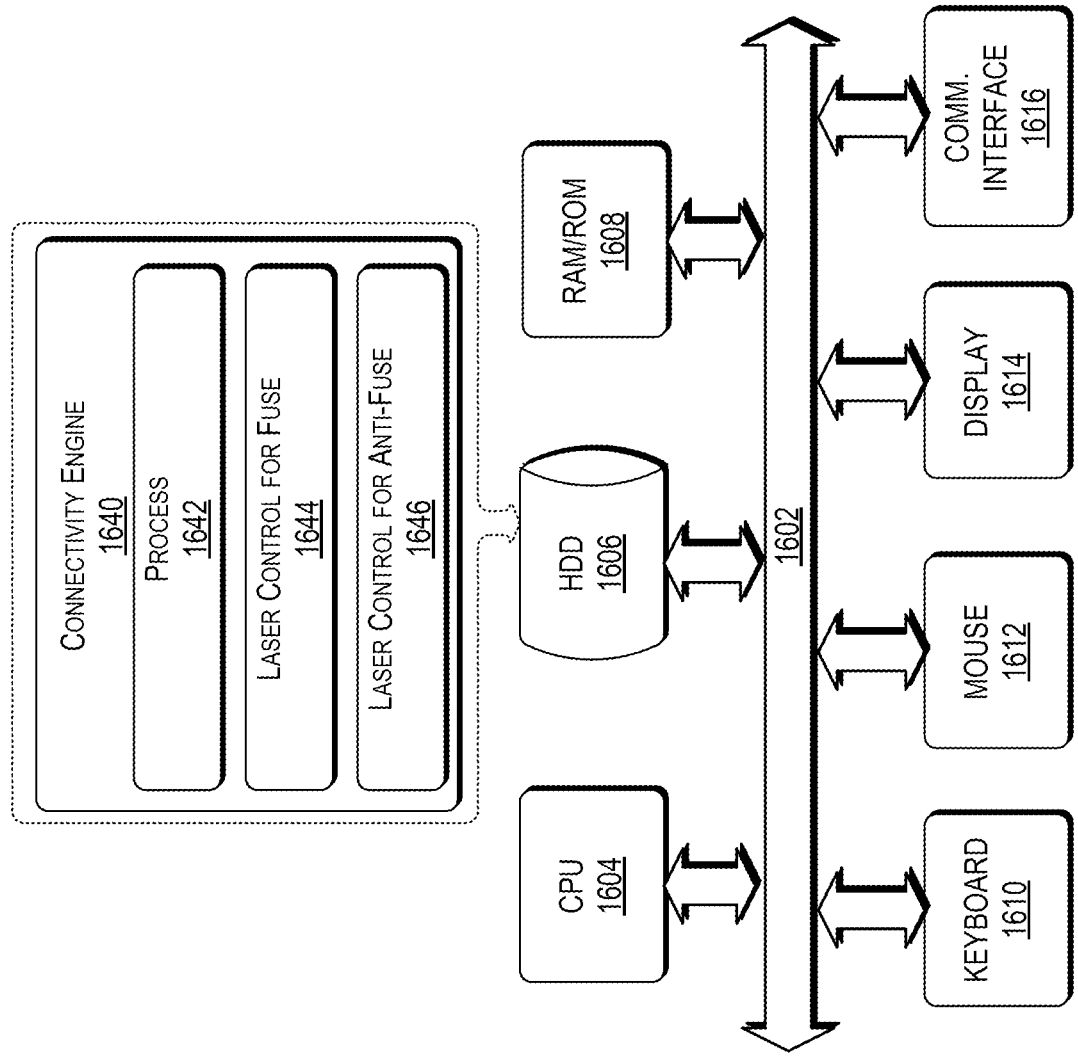
FIG. 16 is a functional block diagram illustration of a computer hardware platform that can be used to control various aspects of a suitable computing environment in which the various embodiments of the features discussed herein can be implemented.

As discussed above, functions relating to methods and systems for providing superconducting switch devices can use of one or more computing devices connected for data communication via wireless or wired communication. FIG. 16 is a functional block diagram illustration of a computer hardware platform that can be used to control various aspects of a suitable computing environment 1600 in which the various embodiments of the features discussed herein can be implemented. While a single computing device is illustrated for simplicity, it will be understood that a combination of additional computing devices, program modules, and/or combination of hardware and software can be used as well. The computer platform 1600 may include a central processing unit (CPU) 1604, a hard disk drive (HDD) 1606, random access memory (RAM) and/or read only memory (ROM) 1608, a keyboard 1610, a mouse 1612, a display 1614, and a communication interface 1616, which are connected to a system bus 1602.

In one embodiment, the HDD 1606, has capabilities that include storing a program that can execute various processes, such as the connectivity engine 1640, in a manner described herein. The connectivity engine 1640 may have various modules configured to perform different functions. For example, there may be a process module configured to control the different manufacturing processes discussed herein and others. There may be a laser control module 1644 operative to provide an appropriate energy output and duration for controlling a state of a fuse. In some embodiments, the same laser control module 1644 can also control antifuses. Alternatively, there can be a separate laser control module 1646 operative to provide an appropriate energy output and duration for controlling a state of an anti-fuse.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of constructing a superconducting switch, comprising:
   depositing a sacrificial layer on top of a substrate;
   patterning the sacrificial layer to remove portions of the sacrificial layer;
   depositing a superconducting metal layer, wherein a first portion of the superconducting metal layer is on top of the substrate, and wherein a second portion of the superconducting metal layer is on top of the sacrificial layer;
   patterning the superconducting metal layer to form a superconducting metal line over the sacrificial layer; and
   etching the patterned sacrificial layer from under the superconducting metal line to release the metal line from the substrate.

2. The method of claim 1, wherein a portion of the superconducting metal line forms an air bridge having a separation from the substrate that is based on a compressive stress in the superconducting metal layer on top of the sacrificial layer.

3. The method of claim 1, wherein the deposition of the superconducting metal layer comprises growing the superconducting metal layer with a compressive stress.

4. The method of claim 3, wherein the compressive stress is higher than a critical buckling stress of the superconducting metal layer.

5. The method of claim 1, wherein the sacrificial layer is 20 nm to 100 nm in thickness.

6. The method of claim 1, wherein the sacrificial layer comprises at least one of Titanium (Ti), Titanium nitride (TiN), an oxide, or a nitride.

7. The method of claim 1, wherein the sacrificial layer is configured to stress the superconducting metal layer.

8. The method of claim 1, further comprising providing etch release holes on the superconducting metal layer.

9. The method of claim 1, wherein the superconducting switch is an anti-fuse.

10. A method of constructing a superconducting switch, comprising:
    depositing a sacrificial layer on top of a substrate;
    patterning the sacrificial layer by etching away at least a portion of the sacrificial layer on a lateral first side and on a lateral opposite second side of the sacrificial layer, while maintaining a portion of the sacrificial layer that is between the lateral left side and the lateral opposite second side;
    depositing a superconducting metal layer on top of the substrate and the portion of the sacrificial layer that is between the lateral left side and the lateral opposite second side;
    providing a hard mask layer on top of the superconducting metal layer to create a pattern;
    removing a superconducting metal layer side wall on a third side and a fourth side between the lateral first side and the lateral opposite second side of the superconducting metal layer;
    removing the hard mask layer; and
    removing the sacrificial layer.

11. The method of claim 10, wherein the sacrificial layer is 200 nm to 500 nm in thickness.

12. The method of claim 10, wherein the sacrificial layer comprises at least one of Titanium (Ti), Titanium nitride (TiN), an oxide, or a nitride.

13. The method of claim 10, wherein the sacrificial layer is configured to stress the superconducting metal layer to facilitate a separation of the superconducting metal layer.

14. The method of claim 10, further comprising providing etch release holes on the superconducting metal layer.

15. The method of claim 10, wherein a layer of the sacrificial layer that is thinner than that of a middle portion is maintained on the lateral first side and the lateral opposite second side of the sacrificial layer by the patterning.

16. The method of claim 10, further comprising smoothing one or more sides of the middle portion of the sacrificial layer.

17. The method of claim 16, wherein smoothing the one or more sides of the middle portion of the sacrificial layer comprises:
    providing a second sacrificial layer on top of or below the first sacrificial layer, wherein a sacrificial layer of the first and second sacrificial layers that is closer to the substrate has an etch rate that is lower than an etch rate of the sacrificial layer thereon; and
    etching the first and second sacrificial layers to provide a curved surface on to which to deposit the superconducting metal layer and configured to prevent a structural damage of the superconducting metal layer during processing.

18. The method of claim 10, wherein the hard mask comprises an oxide.

19. The method of claim 10, wherein the hard mask and the sacrificial layer comprise a same material and are removed concurrently during a same etching step.

20. A method of fabricating a fuse structure, comprising:
    depositing a thin sacrificial layer on top of a substrate,
    patterning the sacrificial layer to remove portions of the sacrificial layer except at a first portion of the substrate;
    depositing a superconducting metal layer on top of the substrate and on top of the sacrificial layer by growing the superconducting metal layer with a compressive stress;
    patterning the superconducting metal layer to form a superconducting metal line over the sacrificial layer; and
    etching the patterned sacrificial layer from under the superconducting metal line to release the metal line from the substrate, wherein a portion of the superconducting metal line forms an air bridge having a separation from the substrate that is based on a compressive stress in the superconducting metal layer on top of the sacrificial layer.

21. The method of claim 20, wherein the compressive stress is higher than a critical buckling stress of the superconducting metal layer.

22. A method of fabricating a fuse structure, comprising:
    depositing a sacrificial layer on top of a substrate;
    patterning the sacrificial layer by etching away at least a portion of the sacrificial layer on a lateral first side and on a lateral opposite second side of the sacrificial layer while maintaining a portion of the sacrificial layer between the lateral first side and the lateral opposite second side;

depositing a superconducting metal layer on top of the substrate and the portion of the sacrificial layer that is between the lateral first side and the lateral opposite second side;

providing a hard mask layer on top of the superconducting metal layer to create a pattern that leaves out a third side and a fourth side of the middle portion of the superconducting metal layer;

removing a superconducting metal layer side wall on the third side and the fourth side between the lateral first side and the lateral second side of the superconducting metal layer;

removing the hard mask layer; and removing the sacrificial layer, wherein the sacrificial layer is configured to stress the superconducting metal layer to facilitate a separation of the superconducting metal layer.

23. The method of claim 22, wherein the sacrificial layer comprises at least one of Titanium (Ti), Titanium nitride (TiN), an oxide, or a nitride.

24. The method of claim 22, wherein a layer of the sacrificial layer that is thinner than that of the middle portion is maintained on the left and right side of the sacrificial layer by the patterning.

25. The method of claim 22, further comprising smoothing one or more sides of the middle portion of the sacrificial layer, comprising:

providing a second sacrificial layer on top of or below the first sacrificial layer, wherein a sacrificial layer of the first and second sacrificial layers that is closer to the substrate has an etch rate that is lower than an etch rate of the sacrificial layer thereon; and etching the first and second sacrificial layers to provide a curved surface on to which to deposit the superconducting metal layer and configured to prevent a structural damage of the superconducting metal layer during processing.

* * * * *